United States Patent
Chou et al.

(10) Patent No.: US 8,288,826 B2
(45) Date of Patent: Oct. 16, 2012

(54) SEMICONDUCTOR-ON-INSULATOR (SOI) STRUCTURES INCLUDING GRADIENT NITRIDED BURIED OXIDE (BOX)

(75) Inventors: Anthony I. Chou, Beacon, NY (US); Toshiharu Furukawa, Essex Junction, VT (US); Wilfried Haensch, Somers, NY (US); Zhibin Ren, Hopewell Junction, NY (US); Dinkar V. Singh, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/290,634

(22) Filed: Nov. 7, 2011

(65) Prior Publication Data

US 2012/0049317 A1 Mar. 1, 2012

Related U.S. Application Data

(60) Division of application No. 12/123,706, filed on May 20, 2008, now Pat. No. 8,053,373, which is a continuation of application No. 11/483,901, filed on Jul. 10, 2006, now Pat. No. 7,396,776.

(51) Int. Cl.
*H01L 29/76* (2006.01)
*H01L 21/00* (2006.01)

(52) U.S. Cl. ........ 257/369; 257/288; 257/348; 257/371; 257/E21.194; 257/E21.268; 257/E21.415; 257/E27.103; 257/E27.112; 438/199; 438/769; 438/770; 438/775; 438/795

(58) Field of Classification Search .................. 257/288, 257/348, 369, 371, E21.194, E21.268, E21.415, 257/E27.103, E27.112; 438/199, 769, 770, 438/775, 795

See application file for complete search history.

(56) References Cited

U.S. PATENT DOCUMENTS

| | | | |
|---|---|---|---|
| 5,468,657 A * | 11/1995 | Hsu | 438/766 |
| 5,939,763 A | 8/1999 | Hao et al. | |
| 5,972,804 A | 10/1999 | Tobin et al. | |
| 6,100,193 A | 8/2000 | Suehiro et al. | |
| 6,136,654 A | 10/2000 | Kraft et al. | |
| 6,245,689 B1 * | 6/2001 | Hao et al. | 438/769 |
| 6,355,579 B1 | 3/2002 | Ra | |
| 6,624,090 B1 | 9/2003 | Yu et al. | |

(Continued)

OTHER PUBLICATIONS

Chong, Daniel "Plasma Charging Damage Immunities of Rapid Thermal Nitrided Oxide and Decoupled Plasma Nitrided Oxide", Proceedings of 10th IPFA 2003 Singapore pp. 141-145.

*Primary Examiner* — Dao H Nguyen
(74) *Attorney, Agent, or Firm* — Scully, Scott, Murphy & Presser, P.C.; Vazken Alexanian

(57) ABSTRACT

A semiconductor-on-insulator structure includes a buried dielectric layer interposed between a base semiconductor substrate and a surface semiconductor layer. The buried dielectric layer comprises an oxide material that includes a nitrogen gradient that peaks at the interface of the buried dielectric layer with at least one of the base semiconductor substrate and surface semiconductor layer. The interface of the buried dielectric layer with the at least one of the base semiconductor substrate and surface semiconductor layer is abrupt, providing a transition in less than about 5 atomic layer thickness, and having less than about 10 angstroms RMS interfacial roughness. A second dielectric layer comprising an oxide dielectric material absent nitrogen may be located interposed between the buried dielectric layer and the surface semiconductor layer.

18 Claims, 4 Drawing Sheets

U.S. PATENT DOCUMENTS

| | | |
|---|---|---|
| 6,642,156 B2 | 11/2003 | Gousev et al. |
| 6,649,538 B1 | 11/2003 | Cheng et al. |
| 7,247,914 B2 | 7/2007 | Uchiyama |
| 7,396,776 B2 | 7/2008 | Chou et al. |
| 7,419,918 B2 * | 9/2008 | Kim et al. .................... 438/775 |
| 2002/0123245 A1 | 9/2002 | Tsujita et al. |
| 2003/0109146 A1 | 6/2003 | Colombo et al. |
| 2003/0143813 A1 | 7/2003 | Khamankar et al. |
| 2003/0216059 A1 | 11/2003 | McFadden et al. |
| 2005/0269602 A1 | 12/2005 | Maruyama et al. |
| 2007/0090493 A1 * | 4/2007 | Dong et al. .................... 257/632 |

* cited by examiner

SEMICONDUCTOR-ON-INSULATOR (SOI) STRUCTURES INCLUDING GRADIENT NITRIDED BURIED OXIDE (BOX)

CROSS REFERENCE TO RELATED APPLICATIONS

This application is a divisional of U.S. patent application Ser. No. 12/123,706, filed May 20, 2008, which is a continuation of Ser. No. 11/483,901 filed on Jul. 10, 2006, now U.S. Pat. No. 7,396,776, the entire content and disclosure of which is incorporated herein by reference.

BACKGROUND

1. Field of the Invention

The invention relates to semiconductor devices, and more specifically to semiconductor-on-insulator (SOI) structures and methods for fabrication thereof to improve metal oxide semiconductor field effect transistor (MOSFET) performance in complementary metal oxide semiconductor (CMOS) devices.

2. Description of the Related Art

The migration and segregation of mobile dopants, such as boron, to oxide materials is a well known phenomenon in semiconductor structures. For example, the migration and segregation of boron to oxide isolation regions may cause narrow width effects in semiconductor channels which in turn may impact a semiconductor device threshold voltage. Within the context of devices fabricated within semiconductor-on-insulator (SOI) structures, the impact of boron migration and segregation may be even more severe since there is typically also a buried oxide interface located below a semiconductor device. In ultra-thin SOI (UTSOI) devices, the boron migration and segregation effect may become even more extreme since an oxide interface typically abuts a boron doped extension region.

A massive loss of boron into an underlying buried oxide (BOX) layer may lead to a high parasitic resistance and a compromised semiconductor device performance. Loss of boron from a substrate into a buried oxide (BOX) layer can also affect operation of devices in which substrate doping is used as a back gate, or where substrate doping is used to set a threshold voltage as in the case of fully-depleted devices with a thin buried oxide (BOX) layer.

A potential solution to boron migration might be the use of a laser or flash anneal process for boron activation, but this solution severely restricts the process flow, and requires that a boron dopant in a semiconductor-on-insulator (SOI) structure never be exposed to a conventional spike anneal once the boron dopant is in place. This solution may lead to increased complexity in device integration, and to added constrains in device design.

Novel buried oxide (BOX) layer structures that may be used within semiconductor-on-insulator (SOI) structures are disclosed in the semiconductor fabrication art.

For example, Hsu, in U.S. Pat. No. 5,468,657, teaches a method for nitridation of a buried oxide (BOX) layer within a semiconductor-on-insulator (SOI) structure formed using a separation by implantation of oxygen (SIMOX) method. The nitridation method uses nitrogen implantation to the same depth to which oxygen is implanted during the separation by implantation of oxygen (SIMOX) method.

In general, one of the drawbacks of the SIMOX process is a high back-interface charge at the oxide/Si interface. The presence of back interface charge can lead to mobility degradation (and hence reduced drive current) in the channel of CMOS transistors fabricated on SIMOX substrates. The degradation is especially severe in CMOS devices fabricated on SIMOX substrates where the active Si layer is thin (<20 nm) as is the case for fully-depleted CMOS fabricated on ultra-thin SOI.

Semiconductor structures are certain to continue to increase in density and decrease in dimension. As a result of these density and dimensional trends, desirable are additional semiconductor structures and methods for fabrication thereof that impede boron or other mobile dopant migration and segregation to an oxide material, such as a buried oxide (BOX) material.

SUMMARY OF THE INVENTION

The invention includes semiconductor structures and methods for fabricating the semiconductor structures. The semiconductor structures selectively incorporate nitrogen into a buried oxide (BOX) layer of a semiconductor-on-insulator (SOI) structure. The methods may be used to tailor the location and concentration profile of the nitrogen in the buried oxide (BOX) layer to block the migration and segregation of boron or other mobile dopants from either an adjoining surface semiconductor layer or an adjoining base semiconductor substrate into the buried oxide (BOX) layer.

A semiconductor-on-insulator (SOI) structure in accordance with the invention includes a buried dielectric layer located interposed between a base semiconductor substrate and a surface semiconductor layer. The buried dielectric layer includes an oxide material having a nitrogen gradient therein that increases at an interface of the buried dielectric layer with at least one of the base semiconductor substrate and the surface semiconductor layer. The buried dielectric layer has an abrupt interface with the at least one of the base semiconductor substrate and surface semiconductor layer that transitions to the at least one of the base semiconductor substrate and the surface semiconductor layer in less than about five atomic layers. Such an abrupt interface is characteristic of an interface formed by direct wafer bonding.

Another semiconductor-on-insulator (SOI) structure in accordance with the invention also includes a buried dielectric layer located interposed between a base semiconductor substrate and a surface semiconductor layer. The buried dielectric layer also includes an oxide material having a nitrogen gradient therein that increases at an interface of the buried dielectric layer with at least one of the base semiconductor substrate and the surface semiconductor layer. The buried dielectric layer has an interfacial roughness with the at least one of the base semiconductor substrate and surface semiconductor layer of less than about 10 angstroms RMS.

Yet another semiconductor-on-insulator (SOI) structure in accordance with the invention also includes a buried dielectric layer located interposed between a base semiconductor substrate and a surface semiconductor layer. The buried dielectric layer also includes an oxide material having a nitrogen gradient therein. The semiconductor-on-insulator (SOI) structure also includes a second dielectric layer located interposed between the buried dielectric layer and the surface semiconductor layer. The second dielectric layer comprises an oxide dielectric material absent nitrogen.

A method for fabricating a semiconductor-on-insulator (SOI) structure in accordance with the invention includes nitriding, while using a thermal nitriding method, an oxide layer located upon a base semiconductor substrate to provide a nitrided oxide layer having a first nitrogen gradient that peaks at an interface of the nitrided oxide layer with the base semiconductor substrate. The method also includes nitriding, while using a plasma nitriding method, the nitrided oxide layer to provide a twice nitrided oxide layer having a second nitrogen gradient that peaks at the exposed surface of the twice nitrided oxide layer. The method also includes laminating a surface semiconductor layer upon an exposed surface of the twice nitrided oxide layer.

BRIEF DESCRIPTION OF THE DRAWINGS

The objects, features, and advantages of the invention will become more apparent upon consideration of the following detailed description, which is read in conjunction with the accompanying drawings, wherein.

DESCRIPTION OF THE PREFERRED EMBODIMENTS

The invention includes semiconductor-on-insulator (SOI) structures and methods for fabricating the semiconductor-on-insulator (SOI) structures. The semiconductor-on-insulator (SOI) structures include nitrogen incorporated as a gradient within a buried oxide (BOX) layer. A nitrogen gradient profile within the buried oxide (BOX) layer is optimized to inhibit mobile dopant (i.e., boron) migration and segregation from both a base semiconductor substrate and a surface semiconductor layer adjoining portions of the buried oxide (BOX) layer within the semiconductor-on-insulator (SOI) structures.

The structures and methods of the embodiments are described in further detail below, and understood within the context of the drawings described above. Since the drawings described above are intended for illustrative purposes only, the drawings are not necessarily drawn to scale.

Figure 1:
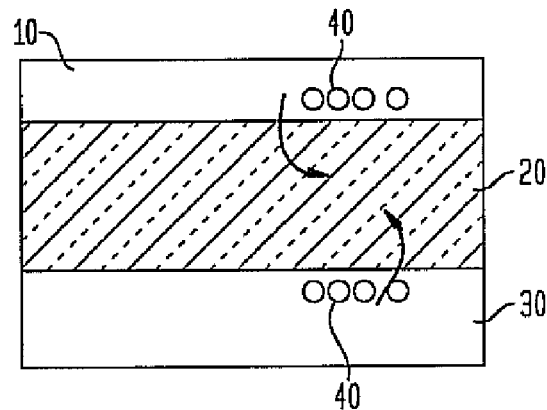
FIG. 1 shows a schematic cross-sectional diagram of a conventional semiconductor-on-insulator (SOI) structure, illustrating mobile dopant (e.g., boron) migration and segregation from a base semiconductor substrate and a surface semiconductor layer into a buried oxide (BOX) layer within the conventional semiconductor-on-insulator (SOI) structure.

FIG. 1 shows a schematic cross-sectional diagram of a semiconductor-on-insulator (SOI) structure in accordance with the prior art. The semiconductor-on-insulator (SOI) structure comprises a base semiconductor substrate 30. A buried oxide (BOX) layer 20 is located upon the base semiconductor substrate 30. A surface semiconductor layer 10 is located upon the buried oxide (BOX) layer 20.

FIG. 1 also shows mobile dopant (e.g., boron) atoms 40 that preferentially migrate and segregate into the buried oxide (BOX) layer 20 from the base semiconductor substrate 30 and the surface semiconductor layer 10 during a generally high temperature (i.e., from about 800° to about 1200° C.) processing step.

Figure 2:
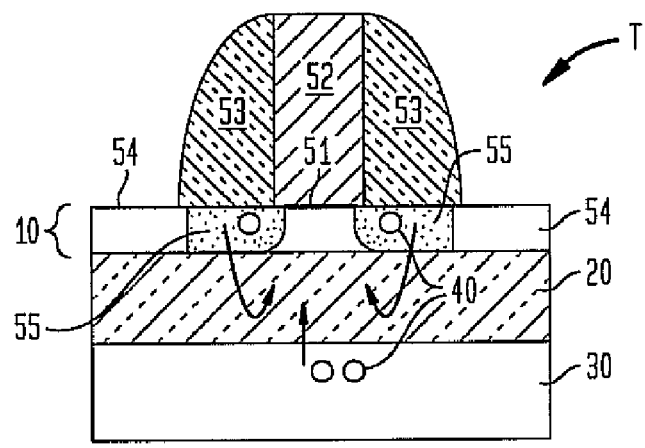
FIG. 2 shows a schematic cross-sectional diagram of a pMOSFET fabricated on a thin semiconductor-on-insulator (SOI) substrate illustrating mobile dopant (e.g., boron) migration and segregation from extension regions into a buried oxide (BOX) layer.

FIG. 2 shows a schematic cross-sectional diagram of a MOSFET, i.e., transistor T, (generally a p-MOSFET) fabricated on a comparatively thin semiconductor-on-insulator (SOI) structure (i.e., the surface semiconductor layer 10 has a thickness from about 30 to about 350 angstroms). The transistor T comprises a gate dielectric 51 located upon the surface semiconductor layer 10. A gate electrode 52 is located aligned upon the gate dielectric 51, although such alignment is not a limitation of the prior art. A pair of spacers 53 (illustrated in cross-section, but intended as representative of a single spacer surrounding the gate 52 in plan-view) adjoin opposite sidewalls of the gate electrode 52 and the gate dielectric 51. Finally, a pair of source/drain regions 54 is located within the surface semiconductor layer 10 and separated by a channel region aligned beneath the gate electrode 52.

FIG. 2 also illustrates migration and segregation of the mobile dopant atoms 40 into the buried oxide (BOX) layer 20 from: (1) a pair of extension region portions 55 of the source/drain regions 54 (i.e., portions of the source/drain region 54 beneath the spacers 53); and (2) the base semiconductor substrate 30. The mobile dopant atoms 40 migration and segregation from the extension region portions 55 of the source/drain region 54 into the buried oxide (BOX) layer 20 is exacerbated in a comparatively thin surface semiconductor layer 10 (i.e., surface semiconductor layer thickness less than about 350 angstroms) when the extension region portions 55 of the source/drain regions 54 abut the buried oxide (BOX) layer 20.

Figure 3:
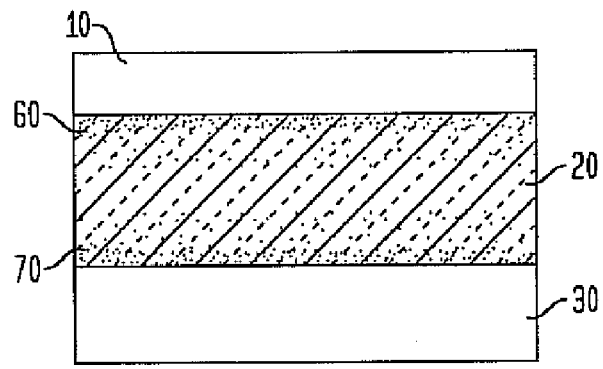
FIG. 3 shows a schematic cross-sectional diagram of an embodiment of a semiconductor-on-insulator (SOI) structure of the invention incorporating tailored gradient nitrogen dopant concentrations at interfaces of a buried oxide (BOX) layer with a base semiconductor substrate and a surface semiconductor layer.

FIG. 3 shows a schematic cross-sectional diagram of an enhanced semiconductor-on-insulator (SOI) structure in accordance with the invention. The enhanced semiconductor-on-insulator (SOI) structure includes a nitrogen gradient within the buried oxide (BOX) layer 20. The nitrogen gradient comprises: (1) a first region of high nitrogen concentration 60 within the buried oxide (BOX) layer 20 adjoining an interface of the semiconductor surface layer 10 and the buried oxide (BOX) layer 20; and (2) a second region of high nitrogen concentration 70 within the buried oxide (BOX) layer adjoining an interface of the base semiconductor substrate 30 and the buried oxide (BOX) layer 20.

Each of the first region of high nitrogen concentration 60 and the second region of high nitrogen concentration 70 comprises a nitrogen concentration from about 0.1 to about 10 atomic percent with respect to an aggregate of silicon atomic concentration and oxygen atomic concentration (i.e., a silicon:oxygen:nitrogen atomic ratio for the first region of high nitrogen concentration 60 and the second region of high nitrogen concentration 70 is from about 30:60:10 to about 333:666:1. A region of the buried oxide (BOX) layer 20 interposed between the first region of high nitrogen concentration of 60 and the second region of high nitrogen concentration 70 has a nitrogen concentration less than about 0.1 atomic percent. The nitrogen gradient is typically continuous, with maximum nitrogen concentrations within the buried oxide (BOX) layer 20 at the interfaces thereof with the surface semiconductor layer 10 and the base semiconductor substrate 30.

The embodiments that follow describe methods for fabricating a semiconductor-on-insulator (SOI) structure generally in accordance with the semiconductor-on-insulator (SOI) structure whose schematic cross-sectional diagram is illustrated in FIG. 3.

FIG. 4A to FIG. 4F show a series of schematic cross-sectional diagrams illustrating the results of progressive stages in fabricating a semiconductor-on-insulator (SOI) structure in accordance with an embodiment of the invention. This embodiment of the invention comprises a first embodiment of the invention.

Figure 4A:
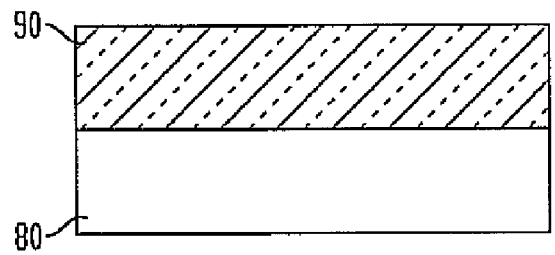
FIGS. 4A-4F show a series of schematic cross-sectional diagrams illustrating the results of progressive stages in fabricating a semiconductor-on-insulator (SOI) structure in accordance with an embodiment of the invention.

FIG. 4A shows a semiconductor substrate 80. A buried oxide (BOX) layer 90 is located upon the semiconductor substrate 80.

The semiconductor substrate 80 may comprise any of several semiconductor materials. Non-limiting examples include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Typically, the semiconductor substrate 80 comprises a silicon or silicon-germanium alloy semiconductor material that has a thickness from about 1 to about 3 mm.

The buried oxide (BOX) layer 90 comprises an oxide dielectric material. The oxide dielectric material may comprise an oxide of an element such as silicon or germanium. Silicon oxide is a common oxide material. Other oxide materials are not excluded. The oxide dielectric material may be formed using any of several methods. Layer transfer methods and laminating methods are common. Also contemplated are deposition methods, such as chemical vapor deposition methods and physical vapor deposition methods. Neither the instant embodiment, nor the invention, uses a separation by implantation of oxygen (SIMOX) method for forming the buried oxide (BOX) layer 90, since an interface of a semiconductor substrate and a buried oxide (BOX) layer formed using a separation by implantation of oxygen (SIMOX) method is often imprecisely defined and has a relatively high concentration of fixed charge which is undesirable. Typically, the buried oxide (BOX) layer 90 comprises a silicon oxide material that has a thickness from about 200 to about 1000 angstroms.

Figure 4B:
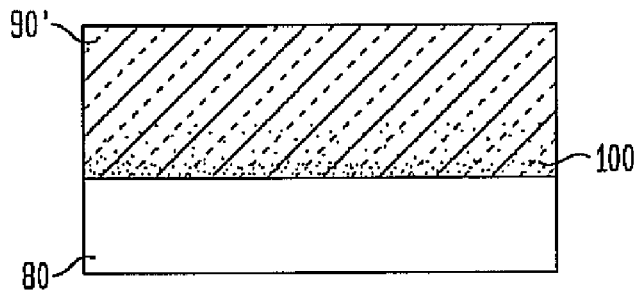

FIG. 4B shows the results of nitriding the buried oxide (BOX) layer 80 to form a first nitrogen gradient 100 within a resulting buried oxide (BOX) layer 90' near an interface of the semiconductor substrate 80 and the resulting buried oxide (BOX) layer 90'. The first nitrogen gradient 100 is formed using a thermal nitridation method. Other methods are not excluded, provided that the other methods form a first nitrogen gradient (similar to the first nitrogen gradient 100) within the buried oxide (BOX) layer 90' near an interface of the semiconductor substrate 80 and the buried oxide (BOX) layer 90'.

The thermal nitridation method allows for diffusion of a nitriding material through the buried oxide (BOX) layer 90 to the interface thereof with the semiconductor substrate 80 when forming the buried oxide (BOX) layer 90'. The thermal nitridation method uses a nitriding material that may be selected from the group consisting of at least nitrogen, nitrous oxide and nitric oxide nitriding materials. Typically, a thermal nitriding method in accordance with the instant embodiment uses a semiconductor substrate 80 and a buried oxide (BOX) layer 90 temperature from about 500° to about 1350° degrees centigrade. Typically, the first nitrogen gradient 100 has a thickness from about 20 to about 1000 angstroms within the buried oxide (BOX) layer 90' adjoining the interface thereof with the semiconductor substrate 80. As disclosed above, the first nitrogen gradient 100 has a nitrogen content from about 0.1 to about 10 atomic percent within the buried oxide (BOX) layer 90' (i.e., silicon:oxygen:nitrogen atomic ratio within the first nitrogen gradient 100 is from about 333:666:1 to about 30:60:10).

Figure 4C:
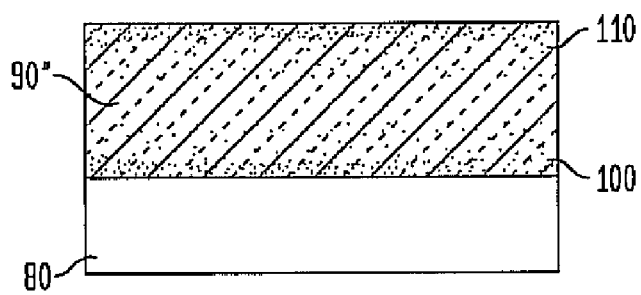

FIG. 4C shows the results of further nitriding of the buried oxide (BOX) layer 90' to form a second nitrogen gradient 110 at the surface of a buried oxide (BOX) layer 90". The further nitriding that provides the second nitrogen gradient 110 within the buried oxide (BOX) layer 90" is effected using a plasma nitriding method that is effectively a surface nitriding method and not a diffusional nitriding method. The plasma nitriding method may use the same nitriding materials as the thermal nitriding method disclosed above for forming the first nitrogen gradient 100 within the buried oxide (BOX) layer 90'. The plasma nitriding method may use generally conventional plasma nitriding conditions, which may be selectively varied within conventional limitations, provided that the dimensions and the concentrations within the second nitrogen gradient are in accordance with the limitations described below.

Similarly with the first nitrogen gradient 100, the second nitrogen gradient 110 typically also has a depth within the buried oxide (BOX) layer 90" from about 20 to about 1000 angstroms. The second nitrogen gradient 110 typically also has a silicon:oxygen:nitrogen atomic ratio in a range analogous to the range of the same parameter for the first nitrogen gradient 100.

Figure 4D:
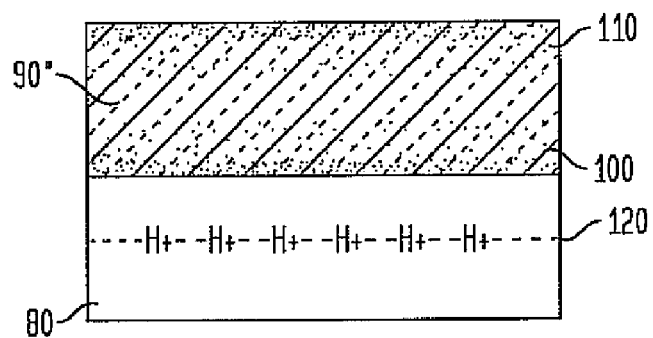

FIG. 4D shows the results of implanting hydrogen ions (with an implant dose from about 5e14 to about 5e16 hydrogen ions per square centimeter) into the semiconductor substrate 80 to form a fracture plane 120 within the semiconductor substrate 80. The fracture plane 120 is intended to be located so as to leave a thickness from about 50 to about 2000 angstroms of the semiconductor substrate 80 to the first nitrogen gradient 100 within the buried oxide (BOX) layer 90". The energy of the hydrogen implant is adjusted based on the position of the fracture plane 120. Alternatively to using the fracture plane 120, other methods for eventually cleaving the semiconductor substrate 80, or alternatively simply thinning the semiconductor substrate 80, may also be used.

Figure 4E:
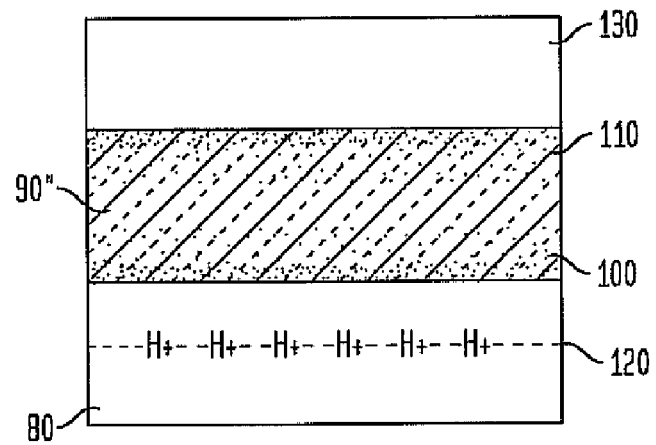

FIG. 4E shows a second semiconductor substrate 130 located upon and laminated to the buried oxide (BOX) layer 90". The second semiconductor substrate 130 may comprise a semiconductor material selected from the same group of semiconductor materials as the semiconductor substrate 80. The semiconductor substrate 80 and the second semiconductor substrate 130 may comprise the same semiconductor material or a different semiconductor material may be used. In addition, the semiconductor substrate 80 and the second semiconductor substrate 130 may have the same or different dopant polarities, dopant concentrations and crystallographic orientations. Typically, the second semiconductor substrate 130 comprises a silicon or silicon-germanium alloy semiconductor material that need not necessarily have the same dopant polarity, dopant concentration and crystallographic orientation as the semiconductor substrate 80.

Figure 4F:
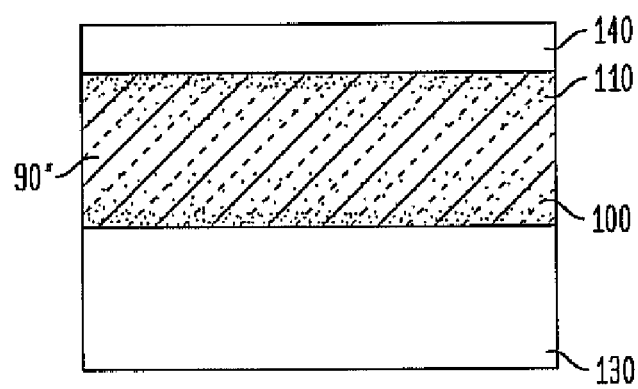

FIG. 4F first shows the results of inverting the semiconductor structure of FIG. 4E.

FIG. 4F also shows the results of cleaving the semiconductor substrate 80 along the fracture plane 120 illustrated in FIG. 4D and FIG. 4E to form therefrom a surface semiconductor layer 140 within a semiconductor-on-insulator (SOI) structure. The semiconductor-on-insulator (SOI) structure comprises the second semiconductor substrate 130 that serves as a base semiconductor substrate. The buried dielectric layer 90" is located upon the second semiconductor substrate 130 wherein the second nitrogen gradient 110 adjoins the second semiconductor substrate 130. The surface semiconductor layer 140 is located upon the buried oxide layer 90", wherein the first nitrogen gradient 100 adjoins the surface semiconductor layer 140.

Cleavage of the semiconductor substrate 80 along the fracture plane 120 that is illustrated in FIG. 4D and FIG. 4E to provide the surface semiconductor layer 140 may be effected using any of several methods that are conventional in the semiconductor fabrication art. Thermally assisted cleavage methods and mechanically assisted cleavage methods are common. Mechanically assisted cleavage methods are typical. As is noted above, alternative thinning methods to cleavage methods may also be used for forming the surface semiconductor layer 140 from the semiconductor substrate 80. Such alternative thinning methods may include, but are not limited to chemical etch thinning methods, mechanical polish thinning methods and chemical mechanical polish thinning methods.

FIG. 4F shows a semiconductor-on-insulator (SOI) structure fabricated in accordance with an embodiment of the invention that comprises a first embodiment of the invention. The semiconductor-on-insulator (SOI) structure comprises a second semiconductor substrate 130 that comprises a base semiconductor substrate. A buried oxide (BOX) layer 90" is laminated and located upon the second semiconductor substrate 130. A surface semiconductor layer 140 is laminated and located upon the buried oxide (BOX) layer 90". The buried oxide (BOX) layer 90" comprises a second nitrogen gradient 110 located within a portion of the buried oxide (BOX) layer 90" that adjoins the second semiconductor substrate 130. The buried oxide (BOX) layer 90" also comprises a first nitrogen gradient 100 located within a portion of the buried oxide (BOX) layer 90" that adjoins the surface semiconductor layer 140. The first nitrogen gradient 100 and the second nitrogen gradient 110 inhibit mobile dopant (i.e., typically boron) migration from either the surface semiconductor layer 140 or the second semiconductor substrate 130 and segregation thereof into the buried oxide (BOX) layer 90".

The semiconductor-on-insulator (SOI) structure in accordance with the first embodiment as illustrated in FIG. 4F has abrupt and sharply defined interfaces of the buried oxide (BOX) layer 90" with the second semiconductor substrate 130 and the surface semiconductor layer 140. The abrupt and sharply defined interfaces result from the use of a deposition method, a laminating method or a layer transfer method when fabricating the semiconductor-on-insulator (SOI) structure. Either of the foregoing two abrupt and sharply defined interfaces of the buried oxide (BOX) layer 90" with the second semiconductor substrate 130 and the surface semiconductor layer 140 typically has: (1) an interfacial roughness of less than about 10 angstroms RMS (where RMS is root mean square, and intended to be calculated as a square root of a sum of squares of individual deviations from a mean value of a location of the interface of the buried oxide layer 90" with either of the surface semiconductor layer 140 or the second semiconductor substrate 130); and (2) a transition from the buried oxide (BOX) layer 90" to either the second semiconductor substrate 130 or surface semiconductor layer 140 within less than about five atomic layers. Atomic layer transitions may be readily discerned using a cross-sectional image taken using a transmission electron microscope (TEM).

For comparison purposes, a semiconductor-on-insulator (SOI) structure that is formed using a separation by implantation of oxygen (SIMOX) method is unlikely to achieve the foregoing interfacial roughness limitations or atomic layer transition limitations. When using a separation by implantation of oxygen (SIMOX) method for forming a semiconductor-on-insulator (SOI) structure related to the semiconductor-on-insulator (SOI) structure that is illustrated in FIG. 4F, an interfacial roughness between a buried oxide (BOX) layer and a surface semiconductor layer or a base semiconductor substrate will typically be greater than 10 angstroms RMS (i.e., root mean square). Similarly, transition from the buried oxide (BOX) layer to the surface semiconductor layer or the base semiconductor substrate for a semiconductor-on-insulator (SOI) structure fabricated using a separation by implantation of oxygen (SIMOX) method typically requires greater than 5 atomic layers. The oxide/Si interface in a SIMOX wafer also typically has higher fixed charge than the oxide/Si interface in an SOI substrate formed by lamination or wafer bonding.

Figure 5A:
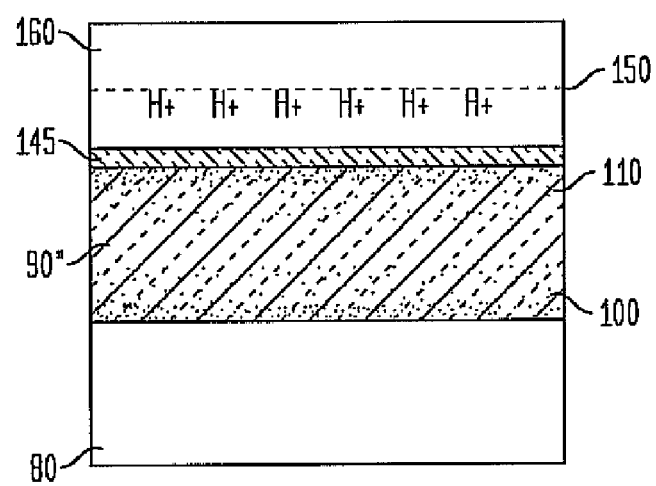
FIGS. 5A and 5B show a pair of schematic cross-sectional diagrams illustrating the results of progressive stages in fabricating a semiconductor-on-insulator (SOI) structure in accordance with an additional embodiment of the invention.
Figure 5B:
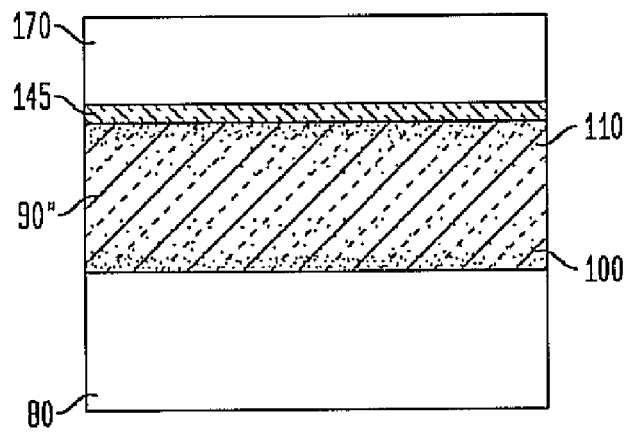

FIG. 5A and FIG. 5B show a pair of schematic cross-sectional diagrams illustrating the results of progressive stages in fabricating a semiconductor-on-insulator (SOI) structure in accordance with another embodiment of the invention. This other embodiment of the invention comprises a second embodiment of the invention.

FIG. 5A shows a schematic cross-sectional diagram of a semiconductor-on-insulator (SOI) structure generally related to the first embodiment. The semiconductor-on-insulator (SOI) structure in accordance with the second embodiment results from further processing of the semiconductor-on-insulator (SOI) structure of FIG. 4C within the first embodiment.

The semiconductor-on-insulator (SOI) structure of the second embodiment that is illustrated in FIG. 5A comprises, in a first instance, the semiconductor substrate 80 that comprises a base semiconductor substrate. The buried oxide (BOX) layer 90" further comprising the first nitrogen gradient 100 and the second nitrogen gradient 110 is located upon the semiconductor substrate 80. The first nitrogen gradient 100 within the buried oxide (BOX) layer 90" contacts the semiconductor substrate 80. The foregoing layers and structures may comprise materials, have dimensions and be formed using methods analogous, equivalent or identical to the materials, dimensions and methods used for forming the like designated layers and structures that are illustrated in FIG. 4C.

The second embodiment also comprises: (1) a second buried oxide (BOX) layer 145 located upon the buried oxide layer 90" and contacting the second nitrogen gradient 110; and (2) a second semiconductor substrate 160 located upon the second buried oxide layer 145. The second semiconductor substrate 160 further comprises a fracture plane 150 that results from hydrogen ion implantation. Thus, within the second embodiment, the buried oxide layer 90" has an abrupt interface with the second buried oxide layer 145 rather than a surface semiconductor layer derived from the second semiconductor substrate 160 subsequent to cleavage of the second semiconductor substrate 160 at the fracture plane 150.

The second buried oxide (BOX) layer 145 may comprise materials and be formed using methods analogous, equivalent or identical to the materials and methods used for forming the buried oxide layer 80 that is illustrated in FIG. 4A (i.e., prior to nitridation thereof to form the buried oxide (BOX) layer 90' or 90"). Thus, the second buried oxide (BOX) layer 145 will typically comprise an oxide comprising silicon and/or germanium, but absent nitrogen. Oxides of other elements are not excluded. Typically, the second buried oxide (BOX) layer 145 has a thickness from about 5 to about 100 angstroms.

The second semiconductor substrate 160 comprising the fracture plane 150 is otherwise analogous to the semiconductor substrate 80 comprising the fracture plane 120 that is illustrated within FIG. 4E. The second semiconductor substrate 160 comprising the fracture plane 150 may be formed using methods analogous, equivalent or identical to the methods used for forming the semiconductor substrate 120 comprising the fracture plane 80 within the first embodiment.

FIG. 5B shows the results of cleaving the semiconductor substrate 160 along the fracture plane 150 that is illustrated in FIG. 5A to form a surface semiconductor layer 170 within a semiconductor-on-insulator (SOI) structure in accordance with the second embodiment of the invention.

The semiconductor-on-insulator (SOI) structure in accordance with the second embodiment thus comprises a semiconductor substrate 80 that comprises a base semiconductor substrate. A buried oxide (BOX) layer 90" is located upon the semiconductor substrate 80. The buried oxide (BOX) layer 90" comprises a first nitrogen gradient 100 including a region that contacts the semiconductor substrate 80 and a second nitrogen gradient 110 at an opposite region thereof. A second buried oxide (BOX) layer 145 contacts the second nitrogen gradient 110 within the buried oxide (BOX) layer 90". A surface semiconductor layer 170 contacts the second buried oxide (BOX) layer 145.

Within the second embodiment, the first nitrogen gradient 100 and the second nitrogen gradient 110 provide the same mobile dopant (i.e., typically boron) migration and segregation inhibition that is discussed above within the context of the first embodiment.

Figure 6:
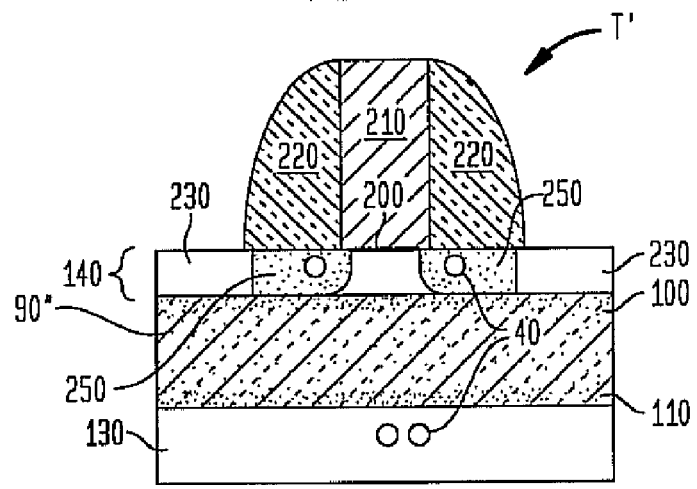
FIG. 6 and FIG. 7 show a pair of schematic cross-sectional diagrams of a metal oxide semiconductor field effect transistor (MOSFET) located within separate semiconductor-on-insulator (SOI) structures in accordance with the embodiments of the invention.

FIG. 6 shows a field effect transistor T' located within the surface semiconductor layer 140 of the semiconductor-on-insulator (SOI) structure of FIG. 4F. The field effect transistor T' comprises a gate dielectric 200 located upon the surface semiconductor layer 140. A gate electrode 210 is located upon the gate dielectric 200. A plurality of spacer layers 220 is located adjoining sidewalls of the gate 210 and gate dielectric 200. A pair of source/drain regions 230 is located within the surface semiconductor layer 140 and separated by a channel region located beneath the gate electrode 210. Extension region portions 250 of the source/drain regions 230 are located beneath the spacer layers 220.

Each of the foregoing layers and structures that comprise the field effect transistor T' may comprise materials, have dimensions and be formed using methods that are generally conventional in the semiconductor fabrication art.

The gate dielectric 200 may comprise a generally conventional gate dielectric material such as an oxide, nitride or oxynitride of silicon having a dielectric constant from about 4 to about 20, measured in vacuum. Oxides, nitrides and oxynitrides of other elements that are in the same dielectric constant range are not excluded. The gate dielectric 200 may also comprise a generally higher dielectric constant gate dielectric material having a dielectric constant from about 20 to at least about 100, also measured in vacuum. Examples of such generally higher dielectric constant gate dielectric materials include, but are not limited to: hafnium oxides, hafnium silicates, tantalum oxides, titanium oxides, lanthanum oxides, barium-strontium titanates (BSTs) and lead-zirconate titanates (PZTs).

The foregoing gate dielectric materials may be deposited using any of several methods that are appropriate to their materials of composition, and are otherwise conventional in the semiconductor fabrication art. Non-limiting examples of methods include chemical vapor deposition methods (including atomic layer chemical vapor deposition methods) and physical vapor deposition methods (including sputtering methods).

The gate electrode 210 may similarly comprise any of several gate electrode conductor materials. Non-limiting examples include certain metals, metal alloys, metal silicides and metal nitrides. Also included are doped polysilicon (i.e., having a dopant concentration from about 1e18 to about 1e22 dopant atoms per cubic centimeter) gate electrode materials and polycide (doped polysilicon/metal silicide stack) gate electrode materials.

The gate electrode conductor materials may also be formed using any of several methods that are appropriate to their materials of composition. Non-limiting examples include plating methods, chemical vapor deposition methods and physical vapor deposition methods.

The spacers 220 typically comprise a dielectric spacer material, although spacers comprising conductor spacer materials are also known in the semiconductor fabrication art. The spacers 220 may alternatively comprise a laminate or composite of dielectric materials and/or conductor materials. The spacers 220 are typically formed using a blanket layer deposition and anisotropic etch back method that provides the spacers 220 with the characteristically inward pointed shape.

The source/drain regions 230 are typically formed using a two step ion implantation method that uses the gate electrode 210, alternatively with and without the spacers 220, as a mask. A first step within the two step ion implantation method uses the gate electrode 210 absent the spacers 220 as a mask and forms extension region portions 250 of the source/drain regions 230 into the surface semiconductor layer 140. A second step within the two step ion implantation method uses the gate electrode 210 and the spacers 220 as a mask to form conductor region portions of the source/drain regions 230 into the surface semiconductor layer 140.

As is illustrated within FIG. 6, the second semiconductor substrate 130 and the extension region portions 250 of the source/drain region 230 may comprise mobile dopants 40 (i.e., typically boron mobile dopants). The mobile dopants 40 are immobilized with respect to migration and segregation into the buried oxide (BOX) layer 90" due to the presence of the first nitrogen gradient 100 and the second nitrogen gradient 110.

FIG. 6 shows a schematic cross-sectional diagram of a field effect transistor structure T' located within a semiconductor-on-insulator (SOI) structure in accordance with the first embodiment of the invention as illustrated in FIG. 4F. The field effect transistor structure T' comprises a quantity of mobile dopants 40 within both: (1) the second semiconductor substrate 130 that comprises a base semiconductor substrate; and (2) the surface semiconductor layer 140. The mobile dopants 40 migration and segregation into the buried oxide (BOX) layer 90" is impeded by the presence of the first nitrogen gradient 110 within the buried oxide (BOX) layer 90" adjoining the surface semiconductor layer 140 and the second nitrogen gradient 100 within the buried oxide (BOX) layer 90" adjoining the second semiconductor substrate 130.

Figure 7:
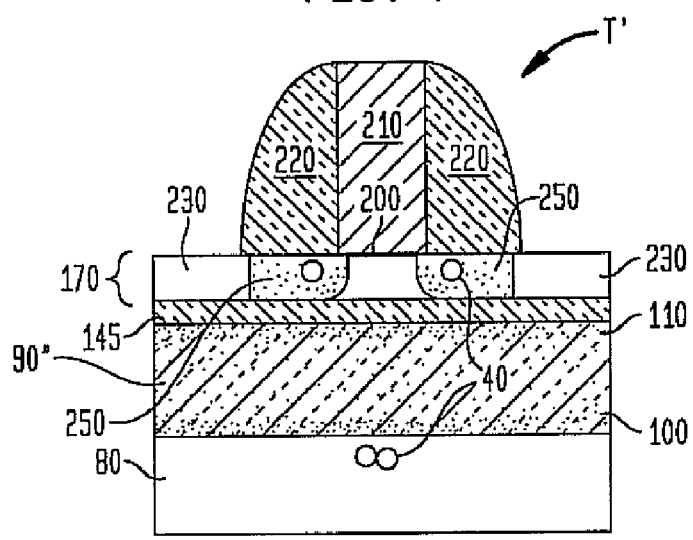

FIG. 7 shows a schematic cross-sectional diagram of a field effect transistor T' located within a semiconductor-on-insulator (SOI) structure in accordance with the second embodiment of the invention as illustrated in FIG. 5B.

FIG. 7 is largely analogous to FIG. 6, but differs with respect to: (1) presence of the semiconductor substrate 80 as a base semiconductor substrate rather than the second semiconductor substrate 130 as the base semiconductor substrate; (2) an inversion of the buried oxide (BOX) layer 90"; (3) incorporation of the second buried oxide (BOX) layer 145; and (4) presence of the surface semiconductor layer 170 in place of the surface semiconductor layer 140.

Within the schematic diagram of FIG. 7, the mobile dopants 40 within the transistor T' are still immobilized by the second nitrogen gradient 110 from migration into the buried oxide (BOX) layer 90", but mobile dopants 40 may migrate and segregate into the second buried oxide (BOX) layer 145 that does not include a nitrogen gradient. The semiconductor structure that is illustrated in FIG. 7 results in significantly higher FET drive current (and hence improved circuit performance) due to reduced device parasitic resistance in the extension and source/drain regions.

Described and illustrated within the context of the foregoing embodiments are structures and methods for minimizing mobile dopant (i.e., boron) migration and segregation from a surface semiconductor layer and a base semiconductor substrate in to a buried oxide (BOX) layer within a semiconductor-on-insulator (SOI) structure. Inhibition of such mobile dopant migration and segregation enables the fabrication of low extension sheet resistance pMOSFETs within comparatively thin surface semiconductor layers (i.e., less than about 350 angstroms) within semiconductor-on-insulator (SOI) structures. Thus, higher performance devices, such as in particular pMOSFET devices, are enabled by the foregoing embodiments. Preventing mobile dopant migration and segregation into a buried oxide (BOX) layer within a semiconductor-on-insulator (SOI) structure is also beneficial for fully-depleted semiconductor-on-insulator (SOI) based devices where a surface semiconductor layer doping is used as a back gate and used to set a threshold voltage.

It should be noted that although the drawings and description provided above show nitrogen gradients at the interface between both of the base semiconductor layer and the surface semiconductor layer, the present invention is not so limited. For example, the nitrogen gradient can be located at only the interface between the base semiconductor layer or the interface between the surface semiconductor layer.

The preferred embodiments of the invention are illustrative of the invention rather than limiting of the invention. Revisions and modifications may be made to methods, materials structures and dimensions of a semiconductor structure in accordance with the preferred embodiments of the invention while still providing a semiconductor structure in accordance with the invention, further in accordance with the accompanying claims.

What is claimed is:

1. A semiconductor-on-insulator structure comprising:
a buried dielectric layer located interposed between a base semiconductor substrate and a surface semiconductor layer, the buried dielectric layer comprising an oxide material including a nitrogen gradient therein that increases at the interface of the buried dielectric layer with at least one of the base semiconductor substrate and the surface semiconductor layer, the buried dielectric layer comprising an abrupt interface with the at least one of the base semiconductor substrate and surface semiconductor layer that transitions to the at least one of the base semiconductor substrate and the surface semiconductor layer in less than about five atomic layers.

2. The semiconductor-on-insulator structure of claim 1 wherein the buried dielectric layer has the abrupt interface with the surface semiconductor layer.

3. The semiconductor-on-insulator structure of claim 1 wherein the buried dielectric layer has the abrupt interface with both the base semiconductor substrate and the surface semiconductor layer.

4. The semiconductor-on-insulator structure of claim 1 wherein the abrupt interface has an interfacial roughness of less than about 10 angstroms RMS.

5. The semiconductor-on-insulator structure of claim 1 wherein the oxide material comprises at least one of a silicon oxide and a germanium oxide.

6. The semiconductor-on-insulator structure of claim 1 wherein said nitrogen gradient comprises a first region of a first nitrogen concentration within the buried dielectric layer and adjoining an interface with the surface semiconductor layer and a second region of a second nitrogen concentration within the buried dielectric layer and adjoining an interface with the base semiconductor substrate, wherein each of the first region and the second region has a concentration of nitrogen from about 0.1 to about 10 atomic percent with respect to an aggregate of silicon atomic concentration and oxygen atomic concentration.

7. The semiconductor-on-insulator structure of claim 6 wherein a silicon:oxygen:nitrogen atomic ratio for the first region of first nitrogen concentration and the second region of second nitrogen concentration is from about 30:60:10 to about 333:666:1.

8. The semiconductor-on-insulator structure of claim 6 wherein a region of said buried dielectric layer interposed between the first region of first nitrogen content and the second region of the second nitrogen content has a nitrogen content of less than about 0.1 atomic percent.

9. The semiconductor-on-insulator structure of claim 1 wherein said surface semiconductor layer has a thickness of less than about 350 angstroms.

10. A semiconductor-on-insulator structure comprising:
a buried dielectric layer located interposed between a base semiconductor substrate and a surface semiconductor layer, the buried dielectric layer comprising an oxide material including a nitrogen gradient therein that increases at an abrupt interface of the buried dielectric layer with at least one of the base semiconductor substrate and the surface semiconductor layer, the buried dielectric layer comprising an interfacial roughness with the at least one of the base semiconductor substrate and surface semiconductor layer of less than about 10 angstroms RMS.

11. The semiconductor-on-insulator structure of claim 10 wherein the buried dielectric layer comprises the interfacial roughness of less than about 10 angstroms RMS with the surface semiconductor layer.

12. The semiconductor-on-insulator structure of claim 10 wherein the buried dielectric layer comprises the interfacial roughness of less than about 10 angstroms RMS with both the base semiconductor substrate and the surface semiconductor layer.

13. The semiconductor-on-insulator structure of claim 10 wherein the abrupt interface has an interfacial transition thickness less than about 5 atomic layers.

14. The semiconductor-on-insulator structure of claim 10 wherein the oxide material comprises at least one of a silicon oxide and a germanium oxide.

15. The semiconductor-on-insulator structure of claim 10 wherein said nitrogen gradient comprises a first region of a first nitrogen concentration within the buried dielectric layer and adjoining an interface with the surface semiconductor layer and a second region of a second nitrogen concentration within the buried dielectric layer and adjoining an interface with the base semiconductor substrate, wherein each of the first region and the second region has a concentration of nitrogen from about 0.1 to about 10 atomic percent with respect to an aggregate of silicon atomic concentration and oxygen atomic concentration.

16. The semiconductor-on-insulator structure of claim 15 wherein a silicon:oxygen:nitrogen atomic ratio for the first region of first nitrogen concentration and the second region of second nitrogen concentration is from about 30:60:10 to about 333:666:1.

17. The semiconductor-on-insulator structure of claim 15 wherein a region of said buried dielectric layer interposed between the first region of first nitrogen content and the second region of the second nitrogen content has a nitrogen content of less than about 0.1 atomic percent.

18. The semiconductor-on-insulator structure of claim 10 wherein said surface semiconductor layer has a thickness of less than about 350 angstroms.

* * * * *